(12) United States Patent
Ishida

(10) Patent No.: US 6,180,986 B1
(45) Date of Patent: Jan. 30, 2001

(54) SEMICONDUCTOR DEVICE AND METHOD OF MANUFACTURING THE SAME

(75) Inventor: Masahiro Ishida, Hyogo (JP)

(73) Assignee: Mitsubishi Denki Kabushiki Kaisha, Tokyo (JP)

(*) Notice: Under 35 U.S.C. 154(b), the term of this patent shall be extended for 0 days.

(21) Appl. No.: 09/227,936

(22) Filed: Jan. 11, 1999

(30) Foreign Application Priority Data

Jul. 28, 1998 (JP) .................................. 10-212783

(51) Int. Cl.$^7$ .......................... H01L 27/01; H01L 29/94; H01L 31/062; H01L 31/113; H01L 31/119

(52) U.S. Cl. .......................... 257/368; 257/350; 257/351

(58) Field of Search .................................. 257/350, 351, 257/368–376, 903–904

(56) References Cited

U.S. PATENT DOCUMENTS

| | | | |
|---|---|---|---|
| 5,898,196 | * | 4/1999 | Hook et al. ............... 257/292 |
| 5,909,400 | * | 6/1999 | Bertin et al. ............... 365/187 |

FOREIGN PATENT DOCUMENTS

| | | |
|---|---|---|
| 3-099464 | 4/1991 | (JP) . |
| 2660056 | 6/1997 | (JP) . |

* cited by examiner

*Primary Examiner*—Minh Loan Tran
*Assistant Examiner*—Cuong Q Nguyen
(74) *Attorney, Agent, or Firm*—McDermott, Will & Emery

(57) ABSTRACT

First and second regions of different thicknesses are provided on a p$^-$ epitaxial layer formed on the main surface of a p$^+$ silicon substrate. A p-well is formed in the first region having a relatively small thickness, and an n-well is formed in the second region having a relatively large thickness. A p MOS transistor is formed on n-well and an n MOS transistor is formed on p-well.

6 Claims, 13 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the device, and more specifically to a semiconductor device having active regions of different conductivity types on a semiconductor substrate and a method of manufacturing the device.

2. Description of the Background Art

Conventionally, as an example of a semiconductor device having active regions of different conductivity types on the same semiconductor substrate, a complementary MOS (metal oxide semiconductor) device (hereinbelow simply referred to as "CMOS") is known which is configured by a p-channel MOS transistor and an n-channel MOS transistor A conventional CMOS is disclosed, for example, in Japanese Patent No. 2660056 (Japanese Patent Laying-Open No. 3-99464). There is a need for established miniaturization techniques that accompany the higher density and higher degree of integration achieved in a CMOS while maintaining its low power consumption characteristic is maintained.

Structurally, a parasitic bipolar transistor circuit is formed inside a CMOS. Since this bipolar transistor circuit has the same configuration as a thyristor, when the circuit is triggered by a surge or the like from outside, excessive current flows from a power supply terminal, and the so-called latchup phenomenon occurs, where the current continues to flow even after the surge or the like no longer exists. This latchup can destroy the device.

Since the latchup phenomenon more readily occurs as the element is miniaturized, a new structure is required which improves latchup resistance as a CMOS is further miniaturized. One example is a retrograde well structure using an epitaxial layer.

FIG. 25 shows a cross sectional view in which a CMOS inverter is formed upon an epitaxial wafer having a thin epitaxial layer formed on a silicon substrate. In addition, FIG. 25 also shows an equivalent circuit diagram of a parasitic thyristor.

As shown in FIG. 25, a p⁻ epitaxial layer 3a is formed on the main surface of a p⁺ silicon substrate 1a. On the boundary portion between p⁻ epitaxial layer 3a and silicon substrate 1a, a p-type impurity region 2a is formed. An n-well 4 and a p-well 5 are formed adjacent to each other in p epitaxial layer 3a. Moreover, a field oxide film 6 is selectively formed on a surface of p⁻ epitaxial layer 3a.

A p MOS transistor is formed on n-well 4, and an n MOS transistor is formed on p-well 5. The p MOS transistor is provided with a source region 8a, a drain region 8b, and a gate electrode 7a. The n MOS transistor is provided with a source region 9a, a drain region 9b, and a gate electrode 7b.

Side wall insulating films 12 are formed on the sidewalls of gate electrodes 7a, 7b. Moreover, an n-well contact region 10 is formed on n-well 4, and a p-well contact region 11 is formed on p-well 5.

N-well contact region 10 and source region 8a are connected to a power supply voltage Vcc, gate electrodes 7a, 7b are connected to an input terminal, and drain regions 8b, 9b are connected to an output terminal. Further, source region 9a and p-well contact region 11 are grounded (GND).

In the above-mentioned configuration, a parasitic vertical pnp bipolar transistor 16a with source region 8a serving as an emitter, n-well 4 as a base, and silicon substrate 1a as a collector, and a parasitic lateral npn bipolar transistor 17a with source region 9a serving as an emitter, p-well 5 as a base, and n-well 4 as a collector are formed. A parasitic thyristor is formed from parasitic vertical pnp bipolar transistor 16a and parasitic lateral npn bipolar transistor 17a.

N-well 4 has a retrograde well structure with a bottom portion having a high impurity concentration. Thus, parasitic resistance RW becomes small, and the difference in potential between the base and the emitter of parasitic vertical pnp bipolar transistor 16a also becomes small. Consequently, parasitic vertical pnp bipolar transistor 16a does not turn on easily. In addition, the impurity concentration in the region corresponding to the base of parasitic vertical pnp bipolar transistor 16a is high, causing more recoupling in the base and leading to a lower current amplification of parasitic vertical pnp bipolar transistor 16a.

Moreover, the use of p⁺ silicon substrate 1a reduces parasitic resistance RS, and the difference in potential between the base and the emitter of parasitic lateral npn bipolar transistor 17a becomes small. Thus, parasitic lateral npn bipolar transistor 17a does not turn on easily. In addition, the impurity concentration in the region corresponding to the base of parasitic lateral npn bipolar transistor 17a becomes high, resulting in more recoupling in the base and leading to a smaller current amplification factor of parasitic lateral npn bipolar transistor 17a.

Therefore, the loop gain of the parasitic thyristor formed by parasitic vertical pnp bipolar transistor 16a and parasitic lateral npn bipolar transistor 17a can be suppressed and latchup resistance may be improved.

In particular, the effect of reduced base resistance of parasitic lateral npn bipolar transistor 17a by the use of p⁺ silicon substrate 1a largely contributes to the improvement in latchup resistance. Through the use of p⁺ silicon substrate 1a, base resistance of parasitic lateral npn bipolar transistor 17a is reduced to one or two orders of magnitude smaller than that in the case of a typical wafer. As a result, the current required to forward bias the pn junction between the base and the emitter of parasitic lateral npn bipolar transistor 17a becomes extremely large. Since this current is provided by the collector current of parasitic vertical pnp bipolar transistor 16a, parasitic vertical pnp bipolar transistor needs to conduct a large current, resulting in high level injection region operation. Thus, the current amplification factor rapidly decreases, and latchup resistance is improved.

In view of the foregoing, it is preferable to reduce the thickness of p⁻ epitaxial layer 3a in order to improve the effect of reduced substrate resistance by p⁺ silicon substrate 1a. In other words, the effect of an epitaxial wafer becomes more conspicuous as the epitaxial layer becomes thinner.

As the epitaxial layer becomes thinner, however, the following problems may arise.

As shown in FIG. 25, p-type impurity region 2a is formed in the boundary portion between p⁺ silicon substrate 1a and p⁻ epitaxial layer 3a. P-type impurity diffuses from p⁺ silicon substrate 1a containing a high concentration of p-type impurity into p⁻ epitaxial layer 3a to form p-type impurity region 2a. Thus, the concentration of p-type impurity in p-type impurity region 2a gradually changes.

When p⁻ epitaxial layer 3a is made thinner in order to increase the effect of the epitaxial wafer as described above, p-type impurity region 2a reaches the high concentration region at the bottom portion of n-well 4, changing the distribution of impurity concentration of n-well 4 significantly. Thus, breakdown voltage between p-type source/ drain regions 8a, 8b and p$^+$ silicon substrate 1a decreases and a punch-through phenomenon occurs.

SUMMARY OF THE INVENTION

The present invention was made to solve such problems as stated above. An object of the present invention is to improve latchup resistance while preventing a punch-through phenomenon.

The semiconductor device in accordance with the present invention is provided with a low specific resistance semiconductor substrate of a first conductivity type having a main surface, an epitaxial layer, a first active region of the first conductivity type, and a second active region of a second conductivity type. The epitaxial layer is formed on the main surface of the low specific resistance semiconductor substrate and includes a first region and a second region. The first region has a first thickness, and the second region has a second thickness larger than the first thickness. The first active region is formed in the first region, and the second active region is formed in the second region. The low specific resistance semiconductor substrate herein refers to a semiconductor substrate having a specific resistance, for example, varying from approximately 0.01 to approximately 0.03 Ω·cm, which is smaller than that of a typical substrate.

The second active region of a different conductivity type from the substrate is formed in the second region having a relatively large thickness as described above to prevent the impurity in the substrate from diffusing into and reaching the second active region. Thus, the impurity concentration of a high concentration portion in the second active region is maintained, and the base parasitic resistance of the parasitic bipolar transistor with the second active region serving as the base can be reduced. As a result, the parasitic bipolar transistor is prevented from being turned on. Moreover, since the impurity concentration in the above-mentioned high concentration portion can be maintained at a high level, a punch-through between the substrate and the element formed in the second active region is also prevented. On the other hand, since the thickness of the first region is made relatively smaller, the impurity region formed by the impurity diffusion from the substrate can reach the first active region. Thus, parasitic resistance of the first active region can be reduced. As a result, the base parasitic resistance of the parasitic bipolar transistor with the first active region serving as the base is reduced, and the parasitic bipolar transistor is kept from being turned on.

An impurity region of the first conductivity type is formed at the boundary portion between the substrate and the epitaxial layer. The impurity region preferably reaches the first active region and is separated from the second active region.

The impurity region reaching the first active region reduces parasitic resistance of the first active region as described above. In addition, since the impurity region is separated from the second active region, the reduction in the impurity concentration of the second active region is suppressed. Therefore, parasitic resistance of the second active region is kept from rising. Moreover, the impurity concentration of the second conductivity type in the second active region is maintained at a high level, leading to improvement in the punch-through resistance between the substrate and the element formed in the second active region and having the impurity region of the first conductivity type. In addition, when the impurity region is separated from the second active region, collector resistance of the parasitic bipolar transistor with the substrate serving as the collector can be increased.

Thus, the current amplification factor of the parasitic bipolar transistor may be lowered.

The first active region preferably includes a first well of a first conductivity type, and the second active region preferably includes a second well of a second conductivity type. An MOS transistor of the second conductivity type is formed on the first well, and an MOS transistor of the first conductivity type is formed on the second well.

The present invention is particularly useful in a semiconductor device having the above-described CMOS structure.

Preferably, a step is formed on the main surface of the substrate. The epitaxial layer surface is planarized. A first region is located on a protruding portion on the main surface, and a second region is located on a recessed portion of the main surface.

Thus, an epitaxial layer having the first and second regions of different thicknesses may be formed on the main surface of the substrate. The above-described effects are obtained from forming such an epitaxial layer.

The main surface may be planarized, and the step may be provided on the surface of the epitaxial layer. In this case, the first region is located on a recessed portion of the epitaxial layer and the second region is located on a protruding portion of the epitaxial layer.

Here also, an epitaxial layer having a first region and a second region of different thicknesses may be formed as in the case described above.

The above-mentioned semiconductor device preferably has a memory cell including a pair of driver MOS transistors, a pair of access MOS transistors, and a pair of load elements.

The present invention is also applicable to a memory device such as an SRAM (Static Random Access Memory).

The present invention is particularly effective for a so-called full CMOS SRAM in which the load element is a p MOS transistor. In the full CMOS SRAM, an MOS and a p MOS exist inside a memory cell. Therefore, there is a possibility of latchup occurring inside the memory cell. Since a minimum design rule applies to a memory cell, it is difficult to provide a guard ring for latchup prevention. Thus, the present invention may be applied to the full CMOS SRAM to improve latchup resistance without providing a guard ring or the like.

The method of manufacturing the semiconductor device in accordance with the present invention includes the following steps. An epitaxial layer including a first region having a first thickness and a second region having a second thickness larger than the first thickness is formed on the main surface of a low specific resistance semiconductor substrate of a first conductivity type. A first active region of the first conductivity type is formed in the first region. A second active region of a second conductivity type is formed in the second region.

Thus, an epitaxial layer including the first and second regions of different thicknesses may be formed on the main surface of the substrate, and a semiconductor device which is capable of reducing the base parasitic resistance of two parasitic bipolar transistors forming a parasitic thyristor is provided.

The step of forming an epitaxial layer preferably includes the following steps. The main surface is selectively etched to form a recessed portion on the substrate. On the main surface, the epitaxial layer is formed covering the recessed portion. A surface of the epitaxial layer is planarized.

Thus, the epitaxial layer having the first and second regions of different thicknesses may be formed on the main surface of the substrate, producing such effects as described above.

The step of planarizing a surface of the epitaxial layer preferably includes the step of forming a mask film on the surface of the epitaxial layer located on the recessed portion, and the step of etching the epitaxial layer using the mask film.

Etching of the epitaxial layer using the mask film leads to etching of a surface of the epitaxial layer located on a protruding portion of the substrate. Thus, the surface of the epitaxial layer may be planarized.

The step of forming the epitaxial layer preferably includes the following steps. The epitaxial layer is formed on the flat main surface. The surface of the epitaxial layer is selectively etched.

In this instance, an epitaxial layer having first and second regions of different thicknesses can be formed as in the case described above.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will be described in relation to FIGS. 1–24 below.

First Embodiment

Figure 1:
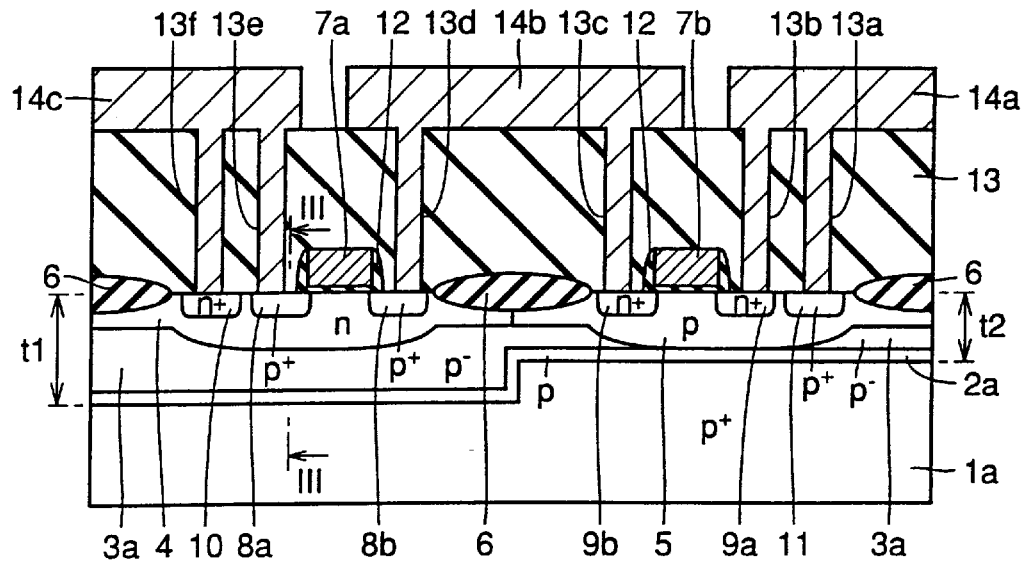
FIG. 1 is a cross sectional view of the CMOS according to the first embodiment of the present invention.
Figure 2:
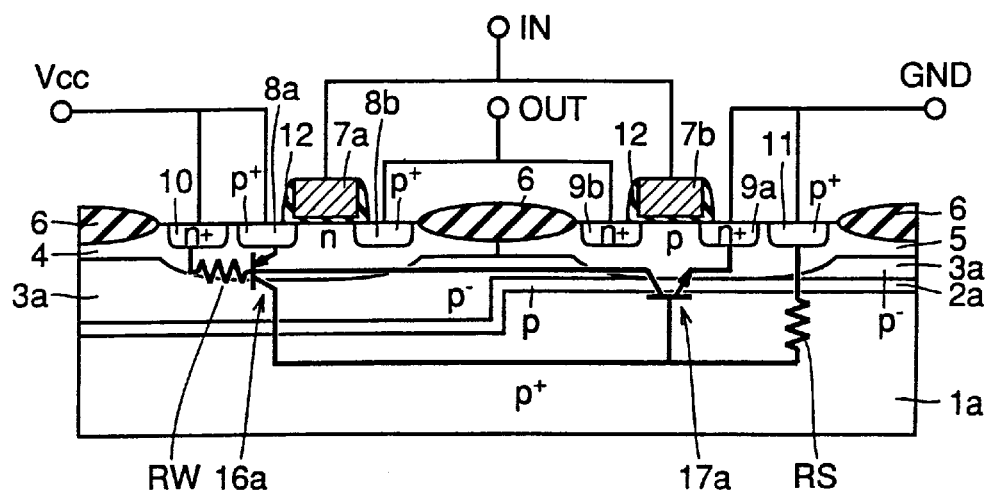
FIG. 2 is a cross sectional view of the CMOS accompanied by an equivalent circuit of a parasitic thyristor.

FIG. 1 is a cross sectional view of the CMOS according to the first embodiment of the present invention. FIG. 2 is a diagram showing a configuration of a CMOS inverter and an equivalent circuit of a parasitic thyristor.

As seen in FIG. 1, a step is provided on the main surface of a $p^+$ silicon substrate 1a, and a $p^-$ epitaxial layer 3a is formed thereon. The specific resistance of $p^+$ silicon substrate 1a ranges from approximately 0.01 to approximately 0.03 $\Omega \cdot$cm. In addition, the specific resistance of $p^-$ epitaxial layer 3a is about 10 $\Omega \cdot$cm, and the concentration of p-type impurity contained in the layer is approximately $1.5 \times 10^{15} \text{cm}^{-3}$.

The surface of $p^-$ epitaxial layer 3a is planarized. $P^-$ epitaxial layer 3a has a first region of a relatively small thickness t2 and a second region of relatively large thickness t1.

P-well (active region) 5 of the same conductivity type as silicon substrate 1a is formed in the first region, and n-well (active region) 4 of a different conductivity type from substrate 1a is formed in the second region. N-well 4 and p-well 5 both have a retrograde well structure, and they each have high concentration portions of n-type and p-type at the bottom portions.

A p-type impurity region (transition region) 2a is formed at the boundary portion between silicon substrate 1a and epitaxial layer 3a. The impurity region 2a is formed when a p-type impurity such as boron (B) in silicon substrate 1a diffuses into epitaxial layer 3a by the heat treatments involved in the formation of epitaxial layer 3a and the formation of a field oxide film 6 described below. Thus, the concentration of the p-type impurity contained in impurity region 2a becomes higher than the concentration of p-type impurity contained in epitaxial layer 3a.

As shown in FIG. 1, p-type impurity region 2a reaches as far as p-well 5, and n-well 4 is separated from p-type impurity region 2a.

A p MOS transistor is formed on n-well 4, and an n MOS transistor is formed on p-well 5. Moreover, an n-well contact region 10 is formed in n-well 4, and a p-well contact region 11 is formed in p-well 5.

The p MOS transistor is provided with p-type source/drain regions 8a, 8b, and a gate electrode 7a. The n MOS transistor is provided with n-type source/drain regions 9a, 9b, and a gate electrode 7b. A sidewall insulating film 12 is formed on the sidewalls of gate electrodes 7a, 7b.

Field oxide film 6 is selectively formed on a surface of $p^-$ epitaxial layer 3a. An interlayer insulating film 13 formed of a silicon oxide film or the like is formed with a thickness of about 100 to about 1,000 nm on $p^-$ epitaxial layer 3a to cover n MOS transistor and p MOS transistor. Contact holes 13a–13f are formed in interlayer insulating film 13. Metal interconnections 14a–14c about 500 to about 2,000 nm thick are formed on interlayer insulating film 13 such that they extend inside contact holes 13a–13f.

Now, with reference to FIG. 2, the description of a CMOS inverter configuration and a parasitic thyristor will be given below.

As shown in FIG. 2, source region 8a and n-well contact region 10 are connected to a power supply voltage Vcc, while gate electrodes 7a, 7b are connected to an input terminal. Drain regions 8b, 9b are connected to an output terminal, and source region 9a and p-well contact region 11 are grounded (GND).

There are a parasitic vertical pnp bipolar transistor 16a having source region 8a serving as an emitter, n-well 4 as a base, and p+ silicon substrate 1a as a collector, and a parasitic lateral npn bipolar transistor 17a having source region 9a serving as an emitter, p-well 5 as a base, n-well 4 as a collector. A parasitic thyristor is formed from these parasitic bipolar transistors.

As seen from above, since an n-type high concentration portion is at the bottom portion of n-well 4, parasitic resistance RW may be reduced. In addition, the use of p+ silicon substrate 1a can reduce parasitic resistance RS. Thus, loop gain of the parasitic thyristor is suppressed, and latchup resistance can be improved.

Moreover, as shown in FIGS. 1 and 2, since n-well 4 is formed in the second region which is relatively thick, a p-type impurity diffusing from p+ silicon substrate 1a into p− epitaxial layer 3a during a heat treatment is kept from reaching n-well 4. In short, p-type impurity region 2a is kept from reaching a high concentration portion of n-well 4.

Now, the impurity profile taken along the line III—III in FIG. 1 will be described in relation to FIGS. 3 and 4.

Figure 3:
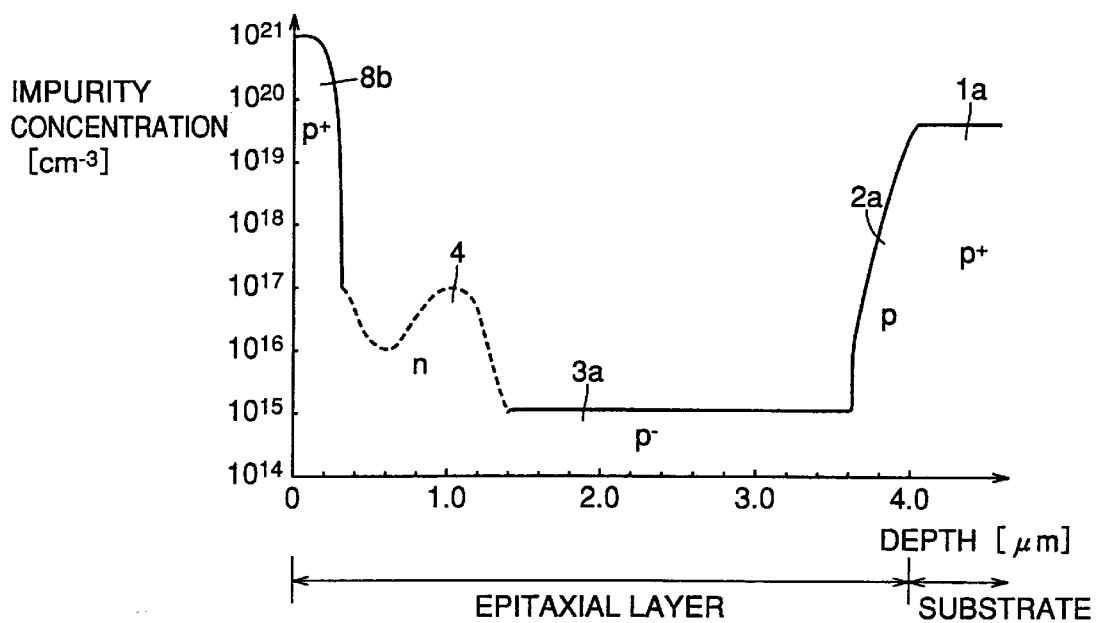
FIG. 3 is a diagram showing an example of an impurity profile taken along the line III—III in FIG. 1.

As shown in FIG. 3, a peak impurity concentration location, or the location in which the impurity concentration of n-type high concentration portion is at its peak, exists at the bottom portion of n-well 4. P− epitaxial layer 3a lies between this peak impurity concentration location and p-type impurity region 2a. Therefore, the consequent lowering of impurity concentration of n-well 4 due to the p-type impurity in p-type impurity region 2a reaching the high concentration portion of n-well 4 can be prevented. Thus, the punch-through resistance between p+ silicon substrate 1a and source/drain regions 8a, 8b in FIGS. 1 and 2 is improved upon the conventional example.

Figure 4:
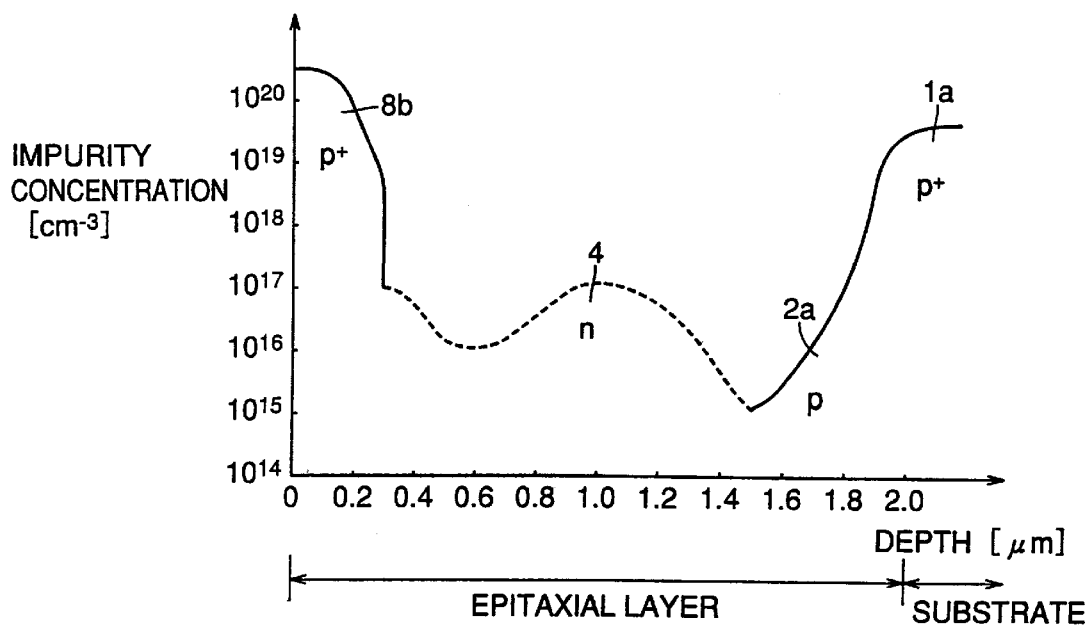
FIG. 4 is a diagram showing a variation of the impurity profile shown in FIG. 3.

Further, as seen from FIG. 4, in the event that p-type impurity region 2a reaches n-well 4, the peak impurity concentration location of the high concentration portion at the bottom portion of n-well 4 may come into contact with p-type impurity region 2a, resulting in a possible decline in punch-through resistance.

Furthermore, the thickness of the first region may be reduced regardless of the thickness of the second region in p− epitaxial layer 3a. More specifically, the thickness of the first region can be reduced to produce the best latchup resistance. Thus, when compared with the conventional example, parasitic resistance RS shown in FIG. 2 can be reduced, and latchup resistance is improved. At the same time, the thickness of the second region may be determined independent of the thickness of the first region, which ensures sufficient punch-through resistance. From the foregoing, according to the present invention, a CMOS having improved latchup resistance as well as punch-through resistance over the conventional example is provided.

Referring now to FIGS. 5–10, the method of manufacturing the CMOS shown in FIG. 1 will be described.

Figure 5:
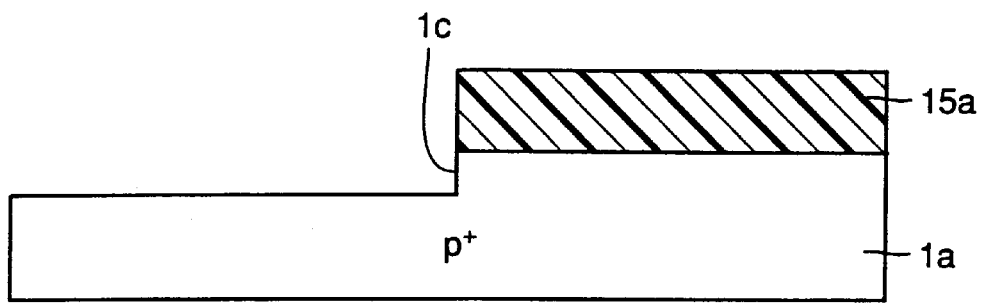
FIGS. 5–10 are cross sectional views showing the first to sixth steps of the manufacturing steps of the CMOS shown in FIG. 1.

As shown in FIG. 5, a resist 15a is applied to the main surface of p+ silicon substrate 1a. After resist 15a is patterned into a prescribed shape, the main surface of p+ silicon substrate 1a is etched using resist 15a as a mask. Thus, a recessed portion 1c having a depth of about 1 to 5 μm is formed.

Figure 6:
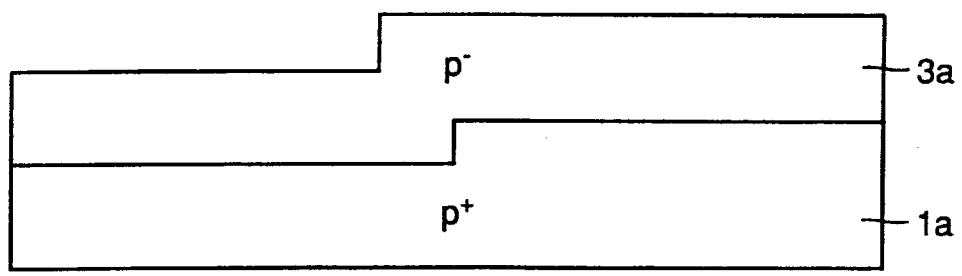

Next, after resist 15a is removed, p− epitaxial layer 3a is formed with a thickness of about 10 μm on the main surface of p+ silicon substrate 1a as shown in FIG. 6.

Figure 7:
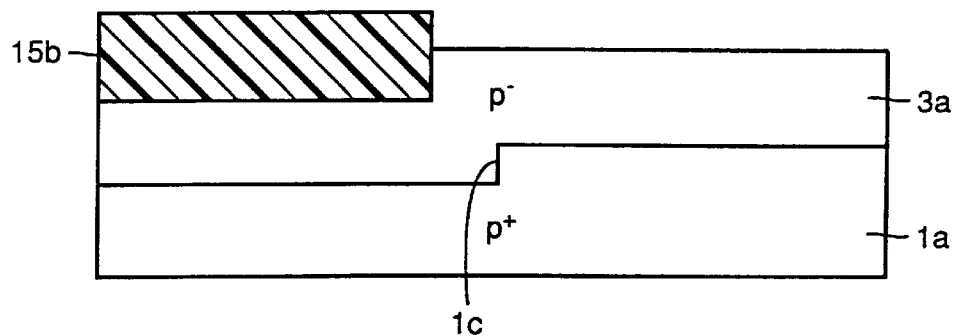

Then, a resist is applied on p− epitaxial layer 3a and is patterned into a prescribed shape so that a resist 15b is formed only on recessed portion 1c as shown in FIG. 7. P− epitaxial layer 3a is selectively etched using resist 15b as a mask. The surface of p− epitaxial layer 3a is thus planarized. Moreover, the surface of p− epitaxial layer 3a may be planarized using a method other than etching. For example, CMP (Chemical Mechanical Polishing) or the like may be employed.

Figure 8:
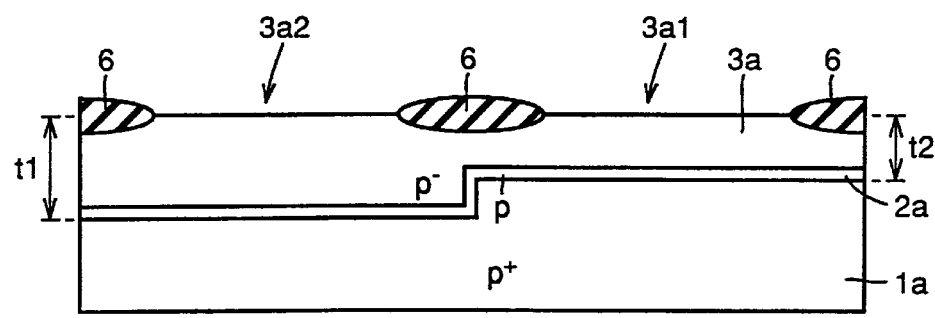

From the above-described planarization of the surface of p− epitaxial layer 3a, first and second regions of different thicknesses may be formed in p− epitaxial layer 3a. More specifically, as shown in FIG. 8, a first region 3a1 having a relatively small thickness t2 and a second region 3a2 having a relatively large thickness t1 may be formed in p− epitaxial layer 3a. Thereafter, field oxide film 6 is selectively formed on the surface of p− epitaxial layer 3a using the LOCOS (Local Oxidation of Silicon) method or the like. P-type impurity diffuses from silicon substrate 1a, thus forming p-type impurity region 2a.

Figure 9:
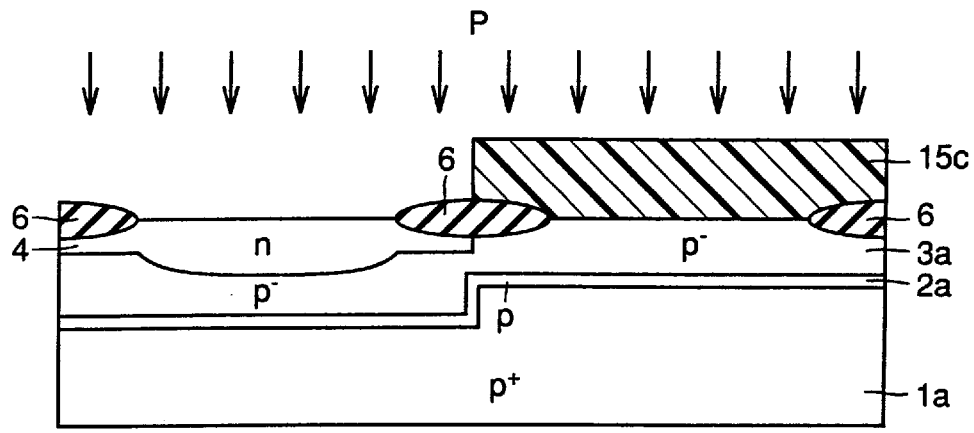

Next, as shown in FIG. 9, a resist 15c is formed covering first region 3a1 and leaving second region 3a2 exposed. With resist 15c used as a mask, phosphorus (P) and boron (B) are implanted into p− epitaxial layer 3a. *Phosphorus (P) is implanted at* 700 keV with a dosage of $1.0 \times 10^{13} \text{cm}^{-2}$, then phosphorus (P) is implanted at 200 keV with a dosage of $1.0 \times 10^{12} \text{cm}^{-2}$, and then, boron (B) is implanted at 20 keV with a dosage of $1.5 \times 10^{12} \text{cm}^{-2}$. Thus, n-well 4 is formed.

Figure 10:
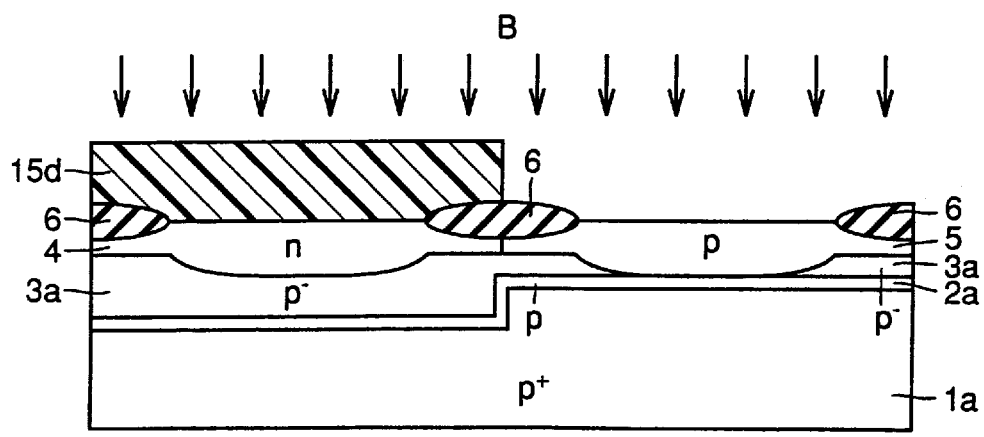

Thereafter, as shown in FIG. 10, a resist 15d is formed covering second region 3a2 and leaving first region 3a1 exposed. With resist 15d used as a mask, boron (B) is implanted into p− epitaxial layer 3a at 400 keV with a dosage of $1.0 \times 10^{13} \text{cm}^{-2}$, then at 100 keV with a dosage of $1.0 \times 10^{12} \text{cm}^{-3}$, and then at 50 keV with a dosage of $2.5 \times 10^{12} \text{cm}^{-2}$. In this manner, p-well 5 is formed. Since the above-specified conditions for forming n-well 4 and p-well 5 are given merely as an example, other conditions may be adopted.

A gate oxide film having a thickness of about 10 to about 100 m is then formed by thermal oxidation or the like, and a conductive film such as a polycrystalline silicon film is deposited thereon. The conductive film is patterned to form gate electrodes 7a, 7b. Then, to cover the gate electrodes, an insulating film such as a silicon oxide film is deposited, and then the insulating film is etched by dry etching or the like. Thus, a sidewall insulating film 12 is formed.

Next, n-type impurity and p-type impurity are selectively implanted into n-well 4 or p-well 5 to form source/drain regions 8a, 9a, 8b, 9b, an n-well contact region 10, and a p-well contact region 11.

Then, an interlayer insulating film 13 made of a silicon oxide film or the like is formed using a method such as CVD (Chemical Vapor Deposition) method. Contact holes 13a–13f are formed in interlayer insulating film 13 by photolithography and etching. Thereafter, metal interconnections 14a, 14b, 14c made of aluminum or the like are formed using a method such as sputtering. Through the above steps, a CMOS shown in FIG. 1 is formed.

Second Embodiment

Figure 11:
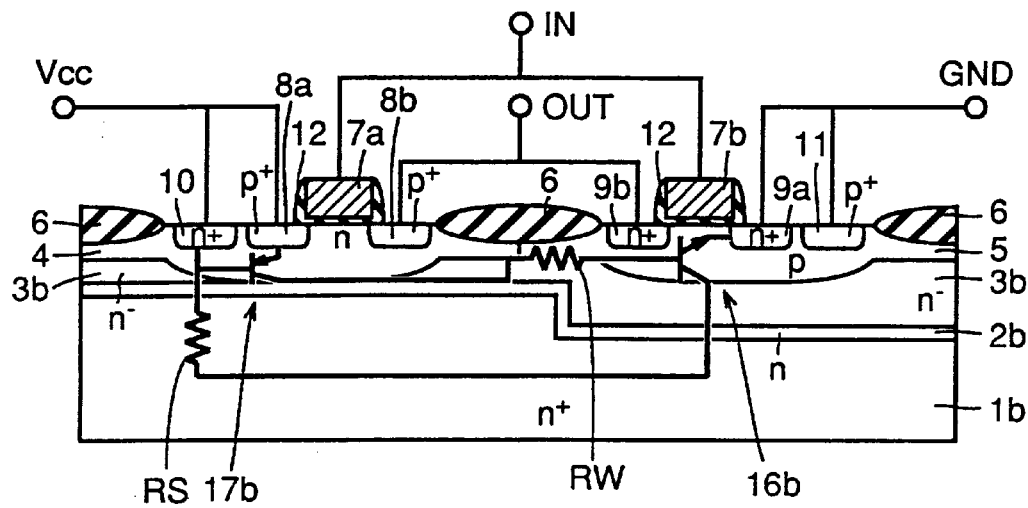
FIG. 11 is a cross sectional view of the CMOS according to the second embodiment accompanied by an equivalent circuit of a parasitic thyristor.

The second embodiment of the present invention will be described in relation to FIG. 11. FIG. 11 is a cross sectional view showing the CMOS according to the second embodiment of the present invention.

Referring to FIG. 11, in the second embodiment, an n− epitaxial layer 3b is formed on the main surface of an n+ silicon substrate 1b with an-type impurity region 2b formed therebetween.

In the second embodiment of the present invention, a parasitic thyristor is formed by a parasitic vertical npn bipolar transistor 16b and a parasitic lateral pnp bipolar transistor 17b.

Other structures are similar to those in the first embodiment. The same effects as those obtained from the first embodiment may be expected from the second embodiment.

As for the method of manufacturing the CMOS according to the second embodiment of the present invention, a recessed portion is formed on the main surface of n⁺ silicon substrate 1b, and n⁻ epitaxial layer 3b having a flat surface is formed covering the recessed portion in a manner analogous to that in the first embodiment. Other processes are similar to as those in the first embodiment.

Third Embodiment

Figure 12:
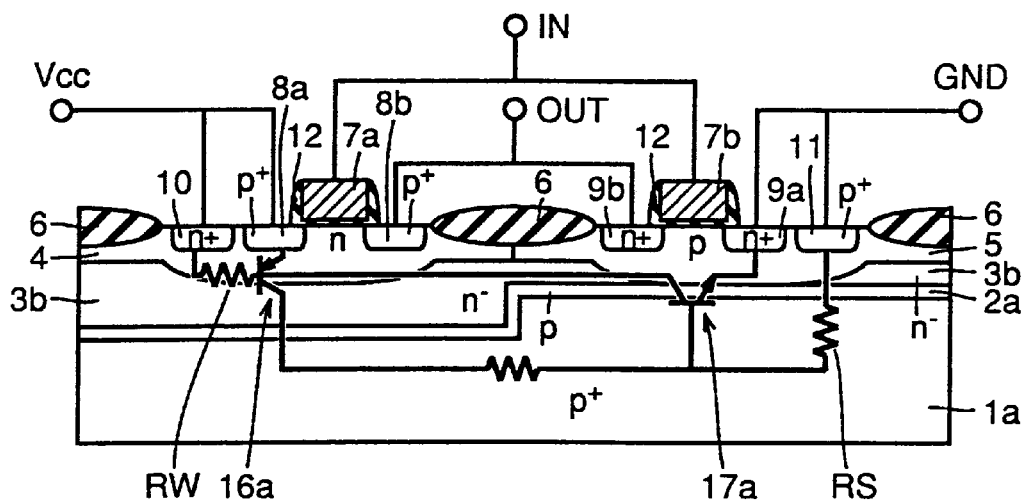
FIG. 12 is a cross sectional view of the CMOS according to the third embodiment accompanied by an equivalent circuit of a parasitic thyristor.

FIG. 12 shows a cross sectional structure of the CMOS according to the third embodiment. In the third embodiment, n⁻ epitaxial layer 3b is formed on the main surface of p⁺ silicon substrate 1a as shown in FIG. 12. Other structures are similar to those in the first embodiment. The same effects as those obtained from the first embodiment may be expected from the third embodiment.

As for the manufacturing method, a recessed portion is formed on the main surface of p+silicon substrate 1a, and n⁻ epitaxial layer 3b having a planarized surface is formed on the recessed portion in a manner analogous to that in the first embodiment. Other processes are similar to those in the first embodiment.

Fourth Embodiment

Figure 13:
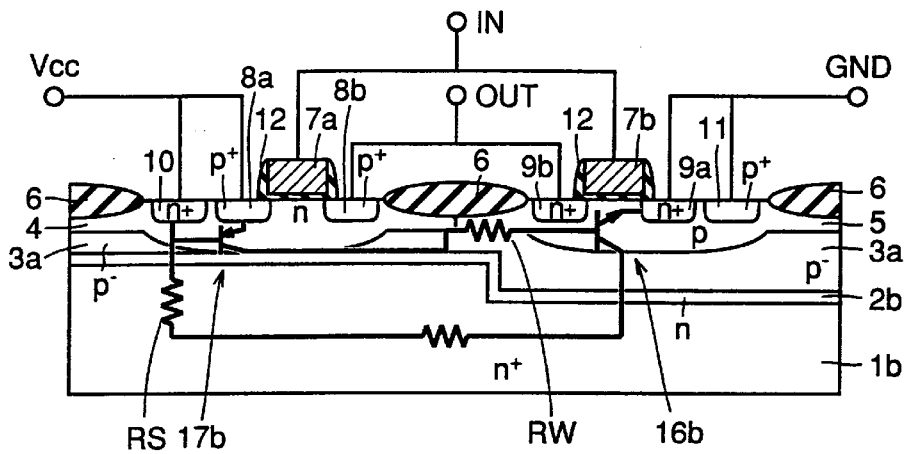
FIG. 13 is a cross sectional view of the CMOS according to the fourth embodiment accompanied by an equivalent circuit of a parasitic thyristor.

FIG. 13 shows a cross sectional structure of the CMOS according to the fourth embodiment. In the fourth embodiment, p⁻ epitaxial layer 3a is formed on the main surface of n⁺ silicon substrate 1b as shown in FIG. 13. Moreover, a parasitic thyristor is formed by a parasitic vertical npn bipolar transistor 16b and a parasitic lateral pnp bipolar transistor 17b. Other structures are similar to those in the first embodiment. The same effects as those obtained from the first embodiment may be expected from the fourth embodiment.

As for the method of manufacturing the CMOS according to the fourth embodiment, a recessed portion is formed on the main surface of n⁺ silicon substrate 1b, and p⁻ epitaxial layer 3a having a planarized surface is formed on the recessed portion in a manner analogous to that in the first embodiment. Thereafter, through steps similar to those in the first embodiment the CMOS according to the fourth embodiment can be produced.

Fifth Embodiment

Now, the fifth embodiment, in which the concepts of the above four embodiments are applied to an SRAM, will be described with reference to FIGS. 14 and 15. The concepts of the sixth to ninth embodiments described below are also applicable to the SRAM.

Figure 14:
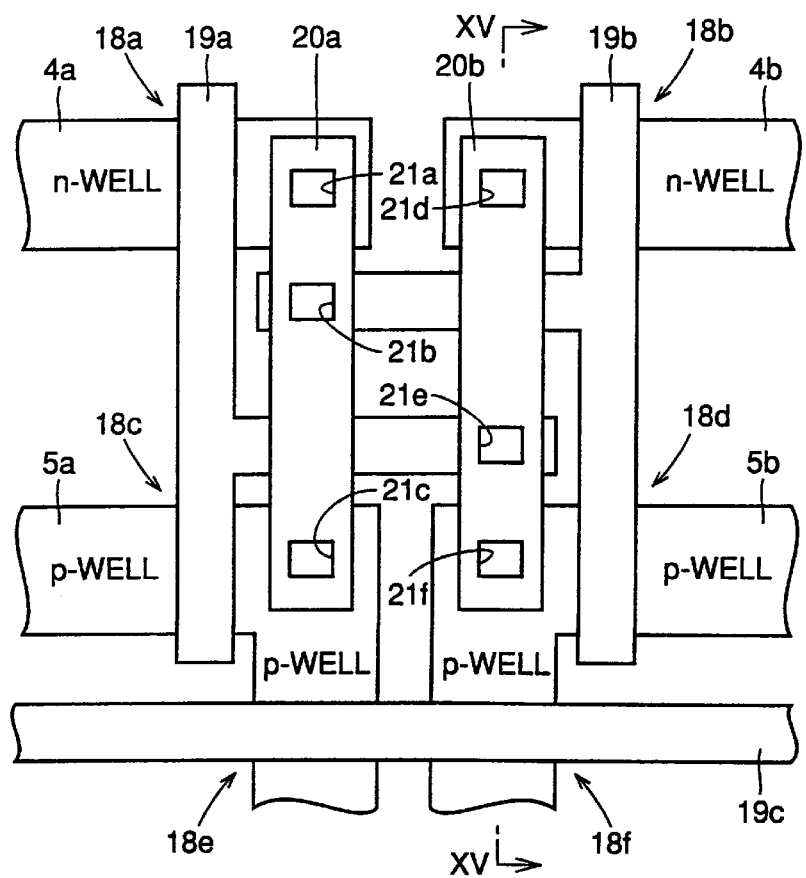
FIG. 14 is a plan view of a memory cell of the SRAM according to the fifth embodiment of the present invention.

FIG. 14 is a plan view of a memory cell of a full CMOS SRAM. FIG. 15 is a cross sectional view taken along the line XV—XV in FIG. 14.

As seen in FIG. 14, n-wells 4a, 4b are formed spaced apart, and p-wells 5a, 5b are formed spaced apart. A gate electrode 19a is formed extending over n-well 4a and p-well 5a, a gate electrode 19b is formed extending over n-well 4b and p-well 5b, and a gate electrode 19c is formed extending over p-wells 5a, 5b.

A p MOS transistor (load transistor) 18a is formed on the intersection portion of gate electrode 19a and n-well 4a, and a p MOS transistor (load transistor) 18b is formed on the intersection portion of n-well 4b and gate electrode 19b.

An n MOS transistor (driver transistor) 18c is formed on the intersection portion of p-well 5a and gate electrode 19a, and an n MOS transistor (driver transistor) 18d is formed on the intersection portion of p-well 5b and gate electrode 19b.

In addition, an n MOS transistor (access transistor) 18e is formed on the intersection portion of p-well 5a and gate electrode 19c, and an n MOS transistor (access transistor) 18f is formed on the intersection portion of p-well 5b and gate electrode 19c.

A prescribed impurity region in n-well 4a, gate electrode 19b, and a prescribed impurity region in p-well 5a are connected by a local interconnection 20a via contact holes 21a–21c. A prescribed impurity region in n-well 4b, gate electrode 19a, and a prescribed impurity region in p-well 5b are connected by a local interconnection 20b via contact holes 21d–21f.

Figure 15:
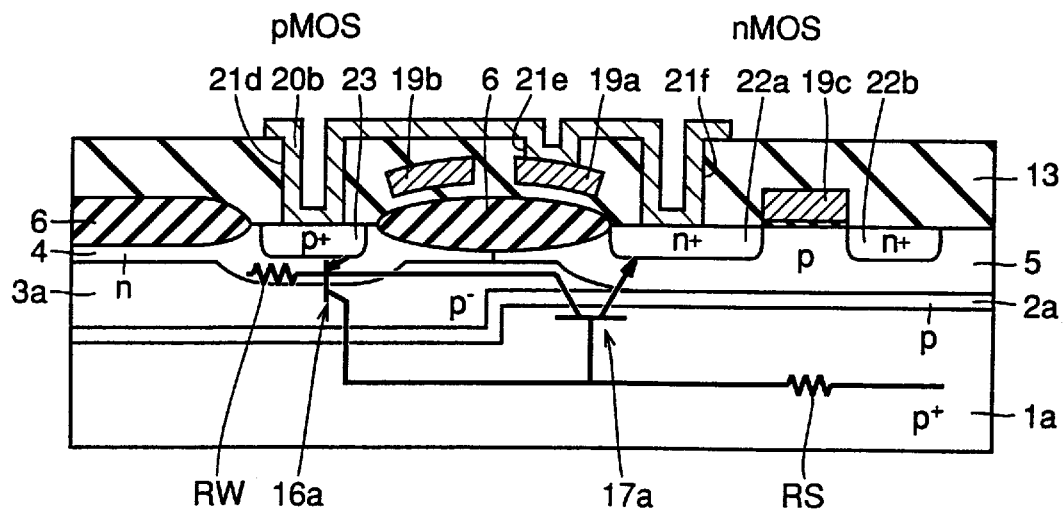
FIG. 15 is a cross sectional view taken along the line XV—XV in FIG. 14.

As seen in FIG. 15, an n MOS transistor is formed on p-well 5 located in a first region of p⁻ epitaxial layer 3a, and a p MOS transistor is formed on n-well 4 located in a second region. The p MOS transistor has a p-type impurity region 23 which later becomes a drain, and n MOS transistor is provided with gate electrode 19c and n-type impurity regions 22a, 22b which later become source/drain.

An interlayer insulating film 13 is formed to cover the p MOS transistor and the n MOS transistor, and contact holes 21d–21f are formed in interlayer insulating film 13. A local interconnection 20b is formed extending from inside contact holes 21d–21f and over interlayer insulating film 13.

Thus, the present invention may be applied to a full CMOS SRAM so that latchup inside a memory cell can be effectively suppressed. Therefore, there no longer is a need to provide a guard ring for latchup prevention inside the memory cell, and the memory cell area may be reduced. The present invention is particularly effective when the cell area becomes smaller with further miniaturization.

Sixth Embodiment

Figure 16:
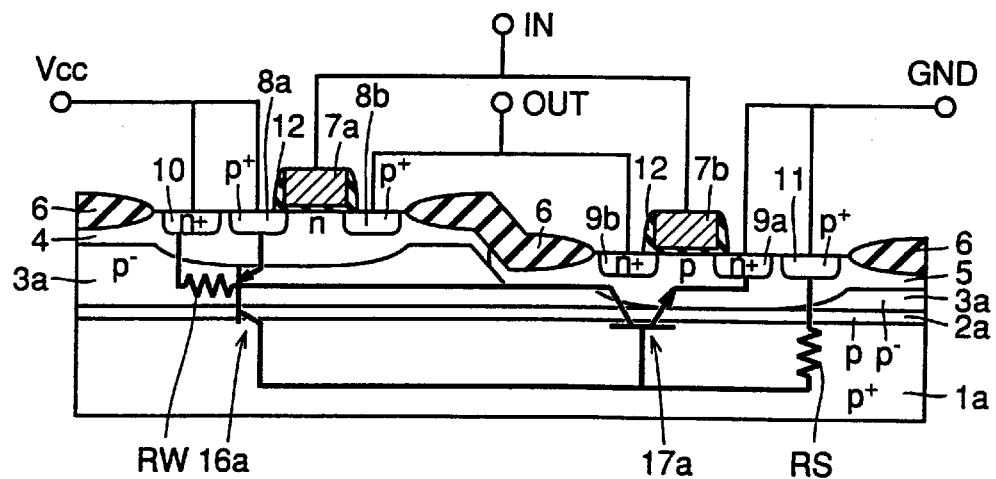
FIG. 16 is a cross sectional view of the CMOS according to the sixth embodiment accompanied by an equivalent circuit of a parasitic thyristor.

FIG. 16 shows the CMOS according to the sixth embodiment of the present invention. As shown in FIG. 16, a step is provided on the surface of a p⁻ epitaxial layer 3a in the sixth embodiment. A first region having a relatively small thickness and a second region having a relatively large thickness are thus formed in p⁻ epitaxial layer 3a. Other structures are similar to those in the first embodiment. The same effects as those obtained from the first embodiment may be expected from the sixth embodiment.

Now, the method of manufacturing the CMOS according to the sixth embodiment will be described in relation to FIGS. 17–21.

Figure 17:
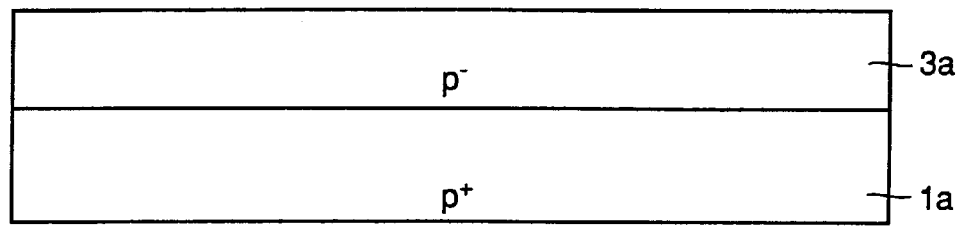
FIGS. 17–21 are cross sectional views showing the first to fifth steps of the CMOS according to the sixth embodiment.
Figure 18:
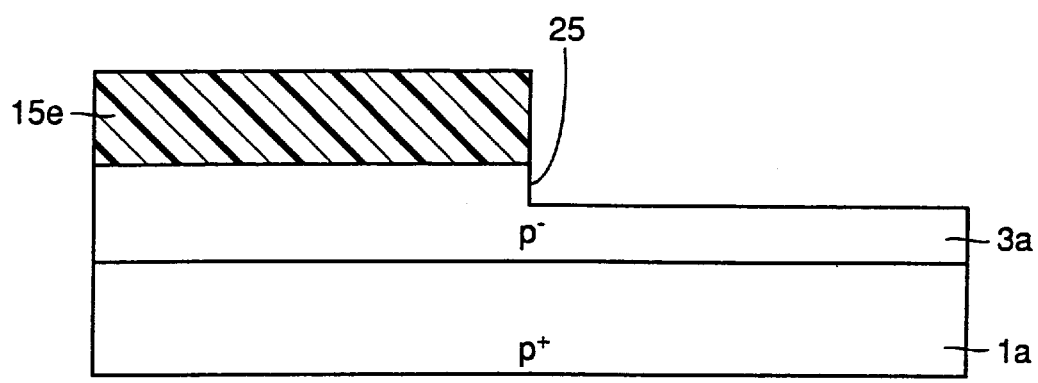
Figure 19:
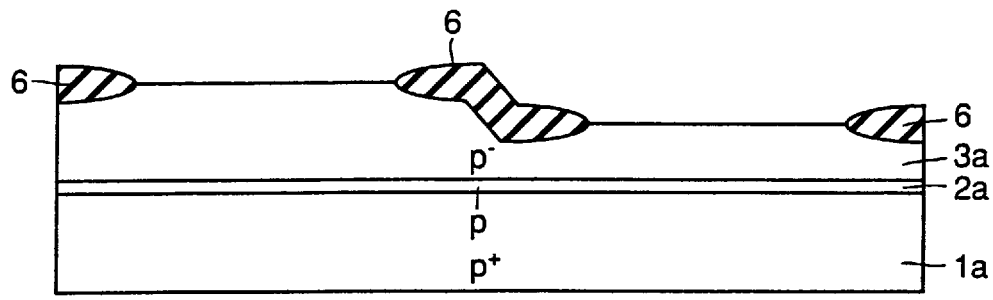

As shown in FIG. 17, p⁻ epitaxial layer 3a is formed on the flat main surface of a p⁺ silicon substrate 1a. A resist 15e is applied on p⁻ epitaxial layer 3a, and is patterned into a prescribed shape. The surface of p⁻ epitaxial layer 3a is selectively etched using resist 15e as a mask. Thus, a recessed portion 25 is formed as shown in FIG. 18.

Resist 15e is then removed, and a field oxide film 6 is formed by the LOCOS method. At the same time, a p-type impurity region 2a is formed.

Figure 20:
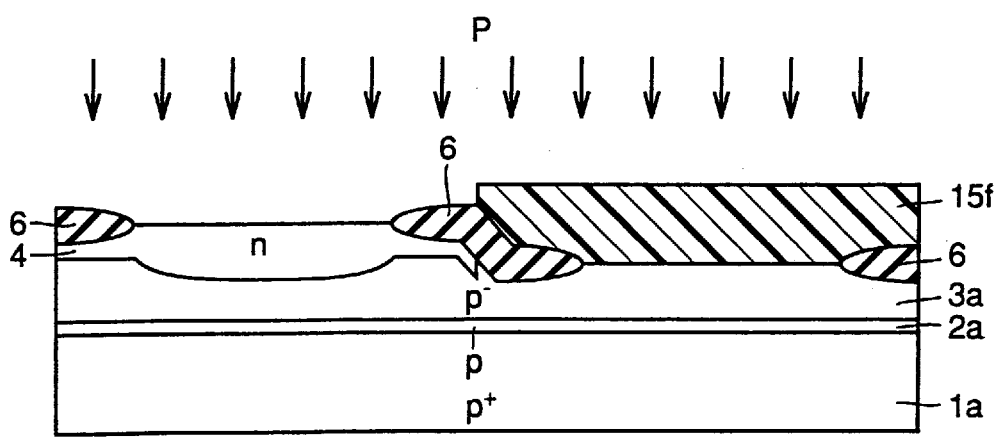
Figure 21:
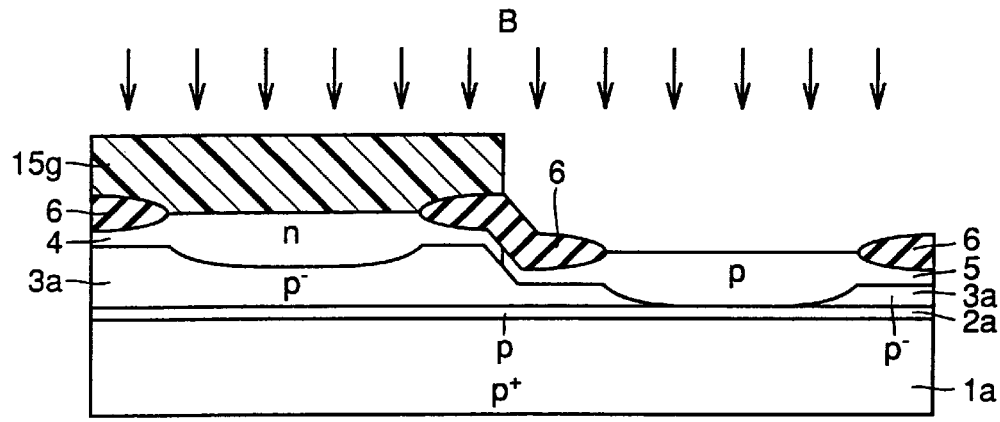

Next, as seen in FIGS. 20 and 21, a n-well 4 and a p-well 5 are formed in a manner analogous to those in the first embodiment. Thereafter, through steps similar to those in the first embodiment, the CMOS according to the sixth embodiment is produced.

Seventh Embodiment

Figure 22:
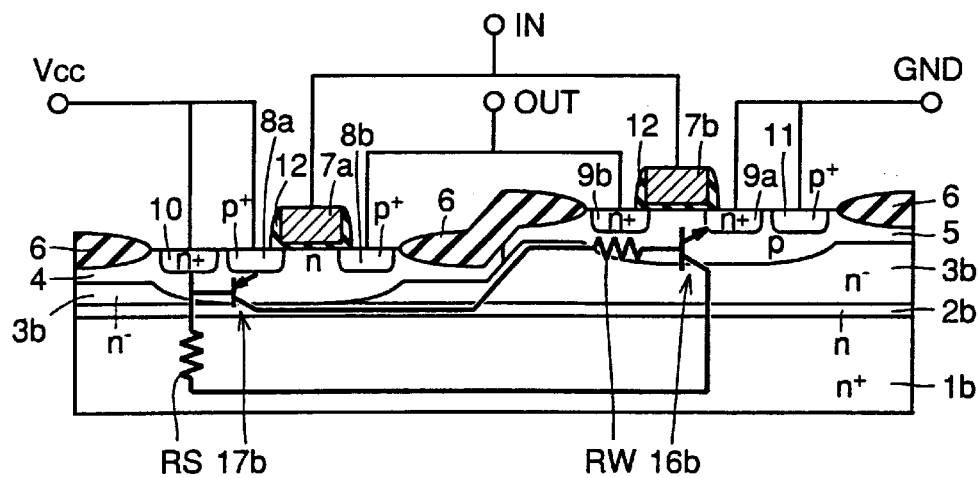
FIG. 22 is a cross sectional view of the CMOS according to the seventh embodiment accompanied by an equivalent circuit of a parasitic thyristor.

FIG. 22 shows a cross sectional structure of the CMOS according to the seventh embodiment. In the seventh embodiment, an n-type impurity region 2b and an n⁻ epitaxial layer 3b are formed on an n⁺ silicon substrate 1b as seen in FIG. 22. Accordingly, a parasitic thyristor is formed by a parasitic vertical npn bipolar transistor 16b and a parasitic lateral pnp bipolar transistor 17b. Other structures are similar to those in the sixth embodiment. Thus, the same effects as those obtained from the sixth embodiment may be expected from the seventh embodiment.

As for the method of manufacturing the CMOS according to the seventh embodiment, n⁻ epitaxial layer 3b is formed on n⁺ silicon substrate 1b, and a step is formed on n⁻ epitaxial layer 3b in a manner analogous to that in the sixth embodiment. Other processes are similar to those in the sixth embodiment.

Eighth Embodiment

Figure 23:
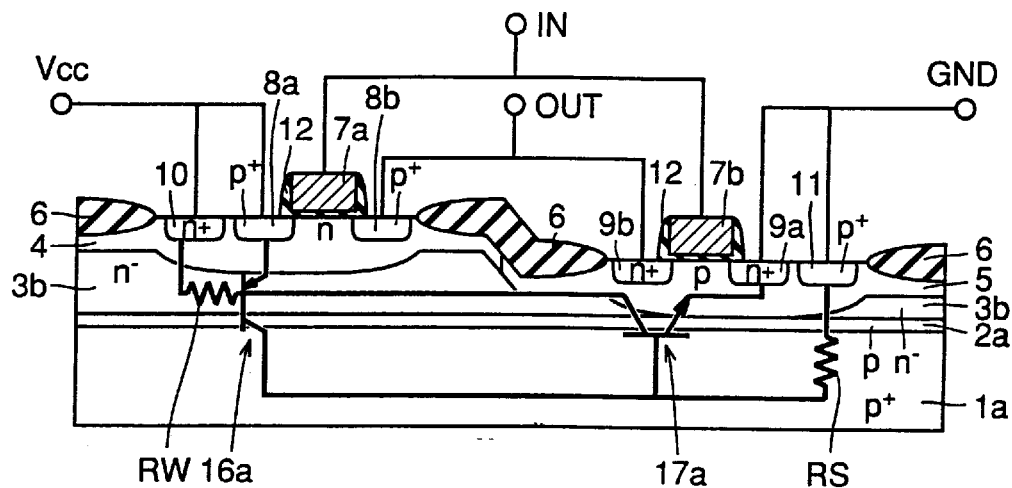
FIG. 23 is a cross sectional view of the CMOS according to the eighth embodiment accompanied by an equivalent circuit of a parasitic thyristor.

FIG. 23 shows a cross sectional structure of the CMOS according to the eighth embodiment. In the eighth embodiment, an n⁻ epitaxial layer 3b is formed on a p⁺ silicon substrate 1a as shown in FIG. 23. Other structures are similar to those in the sixth embodiment. The same effects as those obtained from the sixth embodiment may be expected from the eighth embodiment.

As for the method of manufacturing the CMOS according to the eighth embodiment, n⁻ epitaxial layer 3b is formed on the main surface of p⁺ silicon substrate 1a, and a step is formed on the surface of n⁻ epitaxial layer 3b in a manner analogous to that in the sixth embodiment. Other processes are similar to those in the sixth embodiment.

Ninth Embodiment

Figure 24:
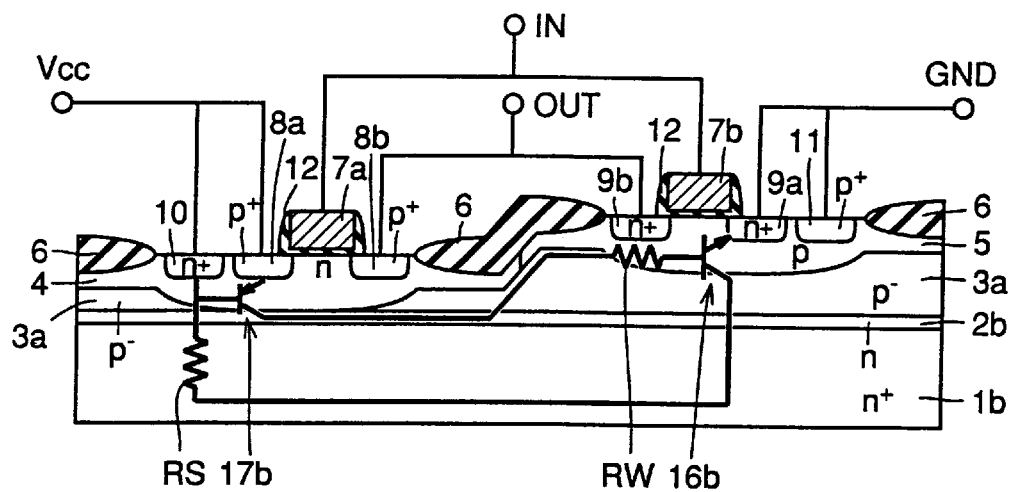
FIG. 24 is a cross sectional view of the CMOS according to the ninth embodiment accompanied by an equivalent circuit of a parasitic thyristor.
Figure 25:
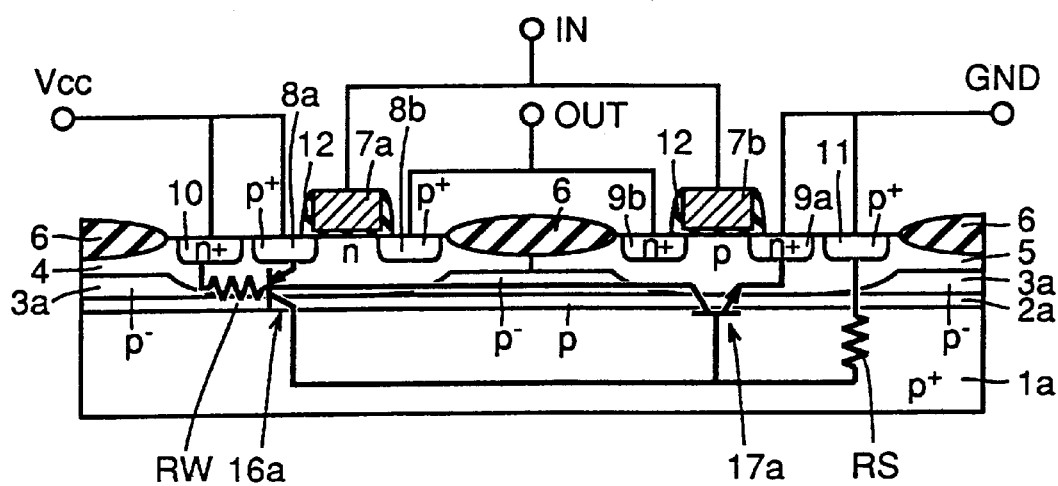
FIG. 25 is a cross sectional view of a conventional CMOS.

FIG. 24 shows a cross sectional structure of the CMOS according to the ninth embodiment. In the ninth embodiment, a p⁻ epitaxial layer 3a is formed on the main surface of an n⁺ silicon substrate 1b as shown in FIG. 24. Other structures are similar to those in the seventh embodiment. Therefore, the same effects as those obtained from the seventh embodiment may be expected.

As for the method of manufacturing the CMOS according to the ninth embodiment, p⁻ epitaxial layer 3a is formed on the main surface of n⁺ silicon substrate 1b, and a step is formed on the surface of p⁻ epitaxial layer 3a in a manner analogous to that in the sixth embodiment. Other processes are similar to those in the seventh embodiment.

While various embodiments have been described above, the concepts of the present invention is applicable to all devices having a CMOS structure including memories such as a DRAM (Dynamic Random Access Memory) or a BiCMOS. When the concept of the present invention is applied to such a device, it is particularly preferable to employ a p⁺ silicon substrate 1a. When applying the present invention to an SRAM, it is preferable to employ an n⁺ silicon substrate 1b. In addition, when the substrate and the epitaxial layer are of the same conductivity type, a single well structure may be employed. Moreover, the provision of a step on the surface of the epitaxial layer as in the sixth to ninth embodiments instead of on the main surface of the substrate as in the first to fifth embodiments reduces the number of process steps involved.

As described above, according to the present invention, since it is possible to reduce the base parasitic resistance of the two parasitic bipolar transistors forming a parasitic thyristor, the parasitic bipolar transistors are kept from being turned on, and latchup resistance is improved. What is more, punch-through between the substrate and an element in the second active region is prevented. As a result, a highly reliable semiconductor substrate is produced.

Although the present invention has been described and illustrated in detail, it is clearly understood that the same is by way of illustration and example only and is not to be taken by way of limitation, the spirit and, scope of the present invention being limited only by the terms of the appended claims.

What is claimed is:

1. A semiconductor device, comprising:
   a low specific resistance semiconductor substrate of a first conductivity type having a main surface;
   an epitaxial layer formed on said main surface and including a first region of a first thickness and a second region of a second thickness larger than said first thickness;
   a first well region of the first conductivity type formed in said first region;
   a second well region of a second conductivity type formed in said second region; and
   an impurity region of said first conductivity type formed at a boundary portion between said substrate and said epitaxial layer, said impurity region reaching said first well region and separated from said second well region.

2. The semiconductor device according to claim 1, further comprising
   an MOS (Metal Oxide Semiconductor) transistor of the second conductivity type provided on said first well region, and
   an MOS transistor of the first conductivity type formed on said second well region.

3. The semiconductor device according to claim 1, wherein a step is formed on said main surface,
   a surface of said epitaxial layer is flat,
   said first region is located on a protruding portion of said main surface, and
   said second region is located on a recessed portion of said main surface.

4. The semiconductor device according to claim 1, wherein said main surface is flat,
   a step is provided on a surface of said epitaxial layer, said first region is located on a recessed portion of said epitaxial layer, and said second region is located on a protruding portion of said epitaxial layer.

5. The semiconductor device according to claim 1, comprising:
   a memory cell including a pair of driver MOS transistors, a pair of access MOS transistors, and a pair of load elements.

6. The semiconductor device according to claim 5, wherein said load elements are MOS transistors.

* * * * *

UNITED STATES PATENT AND TRADEMARK OFFICE
CERTIFICATE OF CORRECTION

PATENT NO. : 6,180,986 B1  Page 1 of 1
DATED : January 30, 2001
INVENTOR(S) : Masahiro Ishida It is certified that error appears in the above-identified patent and that said Letters Patent is hereby corrected as shown below:

Title page,
After Section "[54]", change the title from "SEMICONDUCTOR DEVICE AND METHOD OF MANUFACTURING THE SAME" to -- SEMICONDUCTOR DEVICE HAVING ACTIVE REGIONS OF DIFFERENT CONDUCTIVITY AND METHOD OF MANUFACTURING THE SAME --.

Column 1,
Change the title from "SEMICONDUCTOR DEVICE AND METHOD OF MANUFACTURING THE SAME" to -- SEMICONDUCTOR DEVICE HAVING ACTIVE REGIONS OF DIFFERENT CONDUCTIVITY AND METHOD OF MANUFACTURING THE SAME --.

Signed and Sealed this

Thirtieth Day of October, 2001

Attest:

*Nicholas P. Godici*

NICHOLAS P. GODICI
*Attesting Officer*  *Acting Director of the United States Patent and Trademark Office*